(12) United States Patent
Takemoto et al.

(10) Patent No.: US 9,230,884 B2
(45) Date of Patent: Jan. 5, 2016

(54) SEMICONDUCTOR DEVICE

(71) Applicant: OLYMPUS CORPORATION, Tokyo (JP)

(72) Inventors: Yoshiaki Takemoto, Tokyo (JP); Haruhisa Saito, Tokyo (JP); Hiroshi Kikuchi, Hidaka (JP)

(73) Assignee: OLYMPUS CORPORATION, Tokyo (JP)

( * ) Notice: Subject to any disclaimer, the term of this patent is extended or adjusted under 35 U.S.C. 154(b) by 11 days.

(21) Appl. No.: 13/846,249

(22) Filed: Mar. 18, 2013

(65) Prior Publication Data
US 2013/0256897 A1 Oct. 3, 2013

(30) Foreign Application Priority Data

Mar. 30, 2012 (JP) .................... 2012-081929

(51) Int. Cl.
*H01L 23/48* (2006.01)
*H01L 23/52* (2006.01)
*H05K 1/02* (2006.01)
*H01L 23/31* (2006.01)
*H01L 23/00* (2006.01)

(52) U.S. Cl.
CPC ............ *H01L 23/48* (2013.01); *H01L 23/3142* (2013.01); *H01L 24/83* (2013.01); *H01L 24/92* (2013.01); *H01L 24/94* (2013.01); *H05K 1/02* (2013.01); *H01L 24/05* (2013.01); *H01L 24/80* (2013.01); *H01L 2224/06181* (2013.01); *H01L 2224/08146* (2013.01); *H01L 2224/08148* (2013.01); *H01L 2224/80013* (2013.01); *H01L 2224/80203* (2013.01); *H01L 2224/80895* (2013.01); *H01L 2224/82365* (2013.01); *H01L 2224/83104* (2013.01); *H01L 2224/9212* (2013.01); *H01L 2224/94* (2013.01)

(58) Field of Classification Search
USPC .................................... 257/773–785
See application file for complete search history.

(56) References Cited

U.S. PATENT DOCUMENTS

| | | | | |
|---|---|---|---|---|
| 2001/0029065 A1* | 10/2001 | Fischer et al. | ............... | 438/115 |
| 2007/0080457 A1* | 4/2007 | Tanida et al. | ............... | 257/739 |
| 2011/0186985 A1* | 8/2011 | Sasaki et al. | .................. | 257/737 |
| 2012/0068355 A1* | 3/2012 | Aoki et al. | ................... | 257/774 |

FOREIGN PATENT DOCUMENTS

JP 2010-114350 A 5/2010

* cited by examiner

*Primary Examiner* — Chuong A Luu
*Assistant Examiner* — Cory Eskridge
(74) *Attorney, Agent, or Firm* — Westerman, Hattori, Daniels & Adrian, LLP

(57) ABSTRACT

A substrate may include: a base material having a predetermined thickness; an electrode section formed on one side surface in a thickness direction of the base material, and having a plurality of electrodes; and a concave section formed on at least a part of the surface on which the electrode section is formed, on the base material.

5 Claims, 7 Drawing Sheets

SEMICONDUCTOR DEVICE

BACKGROUND OF THE INVENTION

1. Field of the Invention

The present invention relates to a substrate, and more specifically, to a substrate having a plurality of electrodes formed on a base material to protrude and a semiconductor device using the substrate.

Priority is claimed on Japanese Patent Application No. 2012-081929, filed Mar. 30, 2012, the content of which is incorporated herein by reference.

2. Description of the Related Art

All patents, patent applications, patent publications, scientific articles, and the like, which will hereinafter be cited or identified in the present application, will hereby be incorporated by reference in their entirety in order to describe more fully the state of the art to which the present invention pertains.

A semiconductor device having a three-dimensional structure has attracted interest as an effective structure which avoids various obstacles with which a semiconductor device having a two-dimensional structure has been confronted, such as limits of lithography techniques in miniaturization, increase of wiring resistance caused by miniaturization of a wiring or by increase of wiring length, increase of parasitic effects, tendency of the operation speed to be saturated along therewith, and high electrical field effects due to miniaturization in element dimension, and continues to be improved in integration level by integrating semiconductor elements three-dimensionally in a stacked multi-layer structure by stacking semiconductor active layers.

In manufacturing a semiconductor device having a three-dimensional structure, a stacked-type semiconductor device constructed by bonding wafers having many minute electrodes formed thereon is considered.

For such a stacked-type semiconductor device, in order to protect bonded electrodes, a resin may be injected into a gap between wafers. Here, when many minute electrodes are formed, the gap between wafers becomes smaller and it becomes difficult to inject a resin into the gap. Regarding this problem, techniques for maintaining a gap between wafers by providing an insulating spacer on a stacking surface of a wafer are disclosed in Japanese Unexamined Patent Application, First Publication No. 2010-114350.

SUMMARY

A substrate in accordance with a preferred embodiment of the present invention may include: a base material having a predetermined thickness; an electrode section formed on one side surface in a thickness direction of the base material, and having a plurality of electrodes; and a concave section formed on at least a part of the surface on which the electrode section is formed, on the base material.

The substrate in accordance with a preferred embodiment of the present invention may further include, on the base material, a three-dimensionally formed wiring and an interlayer insulating film. The concave section may be formed to reach the base material by passing through the interlayer insulating film.

The one side surface in the thickness direction of the base material may have a plurality of unit areas on each of which the electrode section is formed, and the concave section may be formed to include a boundary line defining the unit area.

A semiconductor device in accordance with a preferred embodiment of the present invention may be formed by bonding at least two substrates having an electrode section formed thereon, wherein at least one of the substrates are in accordance with a preferred embodiment of the present invention.

A gap in the concave section with the substrate bonded to oppose the concave section may be set to be equal to or larger than 4 μm.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative preferred embodiments. Those skilled in the art will recognize that many alternative preferred embodiments can be accomplished using the teaching of the present invention and that the present invention is not limited to the preferred embodiments illustrated for explanatory purpose.

A first preferred embodiment of the present invention will be described with reference to FIG. 1 to FIG. 7B.

Figure 1:
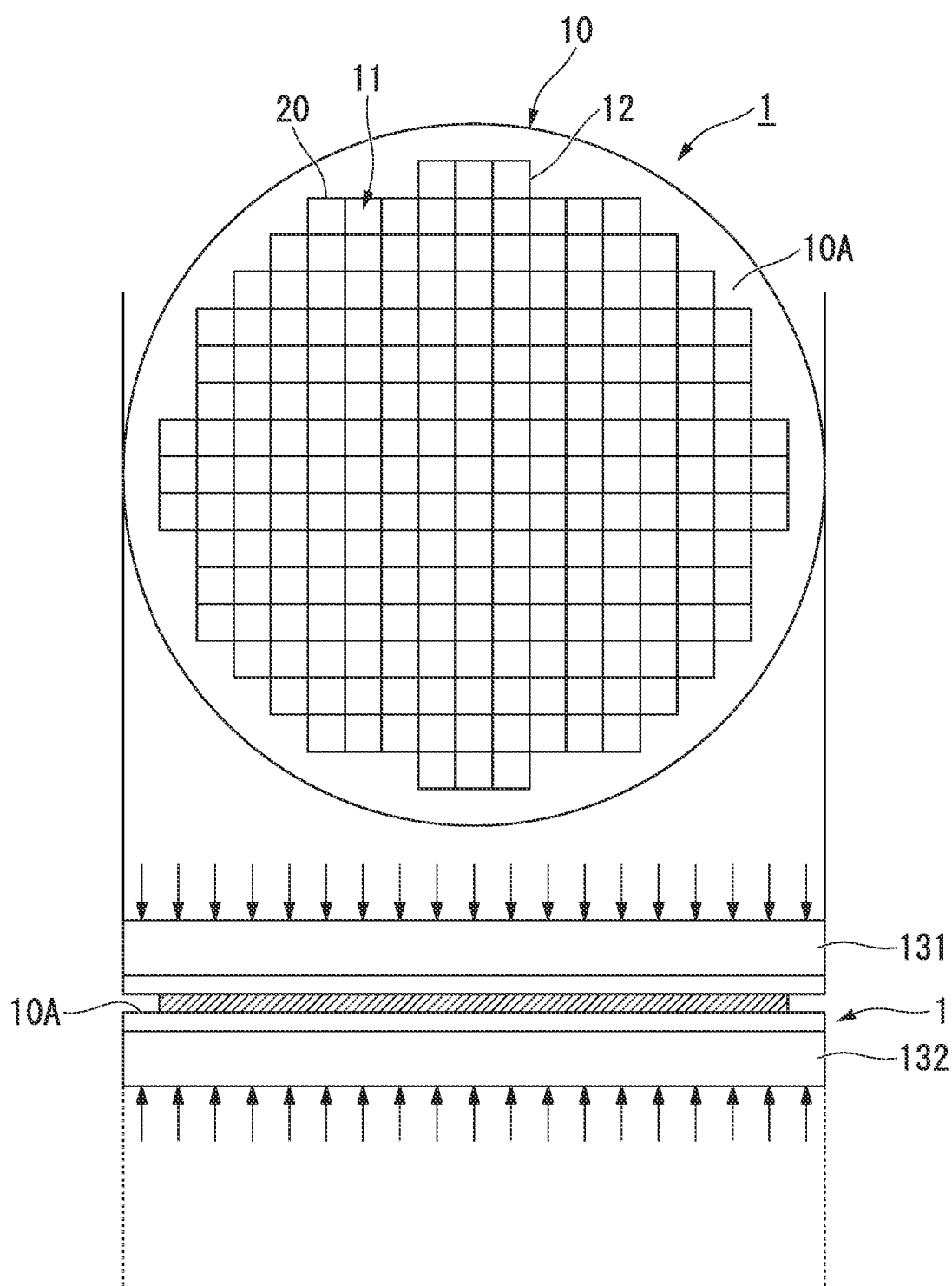
FIG. 1 includes two views, the upper part of FIG. 1 being a plan view showing a substrate in accordance with the first preferred embodiment of the present invention and the lower part of FIG. 1 being a view showing an operation of bonding the substrate in accordance with the first preferred embodiment of the present invention.

The upper part of FIG. 1 is a plan view showing a substrate 1 in accordance with the first preferred embodiment of the present invention. The lower part of FIG. 1 is a view showing an operation of bonding the substrate 1 in accordance with the first preferred embodiment of the present invention. The substrate 1 has a plate-shaped or sheet-shaped base material 10 and an electrode section 20 formed on a surface of the base material 10.

The base material 10 is formed of a plate- or sheet-shaped insulator or a semiconductor having a predetermined thickness. The insulator or the semiconductor forming the base material 10 may be, for example, silicon, resin, ceramics, glass, and so on. The first preferred embodiment of the present invention uses a silicon wafer as the base material 10.

Moreover, although not shown in the drawing, a wiring electrically connected to the electrode section 20 is formed on the base material 10. The wiring aspect may be formed on either one surface or both surfaces of the base material 10 in a thickness direction by printing, etching, and so on, or may be formed to pass through the base material like via, and so on, or may be a three-dimensional wiring using stacking techniques, or may be an appropriate combination thereof.

One surface of the base material 10 becomes a bonding surface 10A bonded with another substrate. The bonding surface 10A is provided with a plurality of rectangular unit areas 11. Each unit area 11 has one electrode section 20 in which a plurality of electrodes are formed in the same layout, and the same wiring aspect is formed in each unit area 11.

Figure 2:
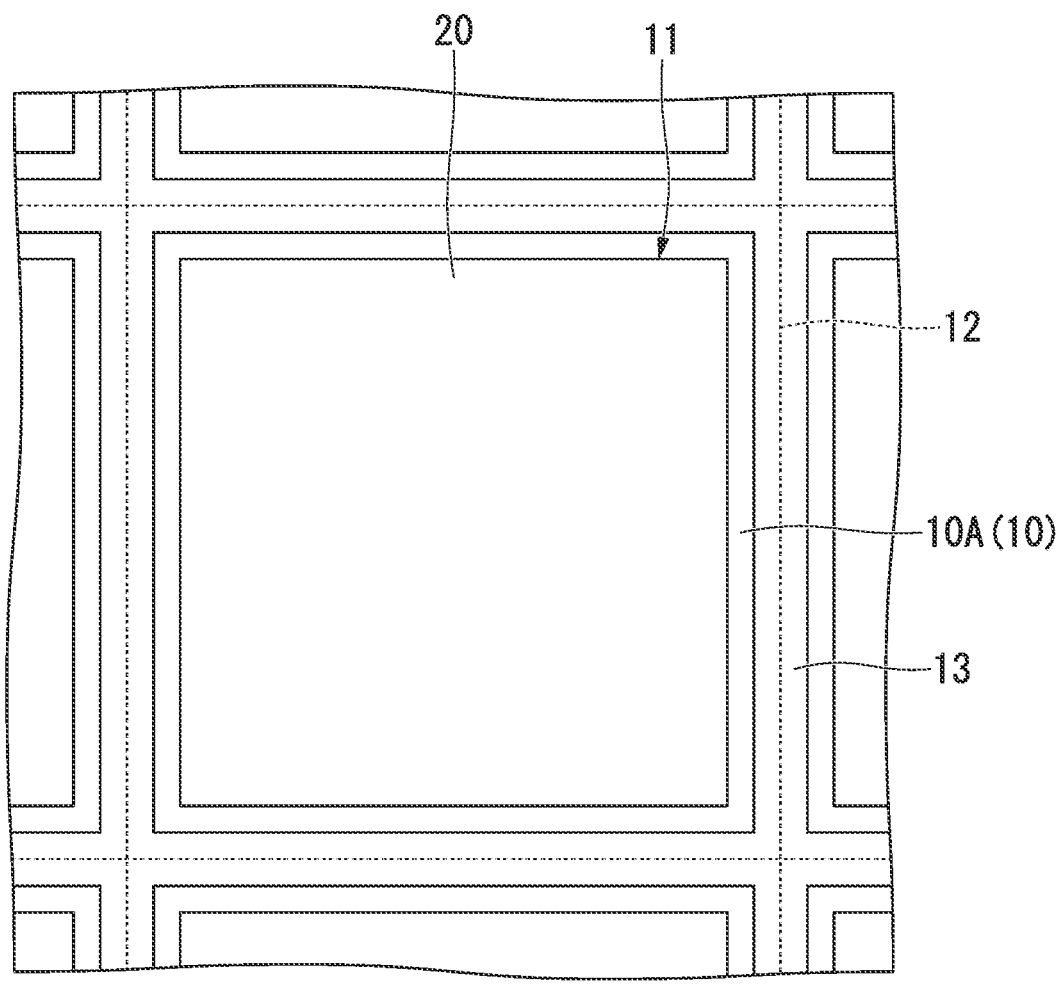
FIG. 2 is a schematic enlarged view showing the unit area of the substrate in accordance with the first preferred embodiment of the present invention.

FIG. 2 is a schematic enlarged view showing the unit area 11. The electrode section 20 is placed at approximately the center of each unit area 11 and formed in a substantially rectangular shape in a plan view of the substrate 1 by two-dimensionally arranging many minute electrodes (not shown) protruding from the base material 10. The electrode of the electrode section 20 may be formed by a conductive material such as a metal, preferably one of gold (Au), copper (Cu), nickel (Ni) and an alloy containing at least one of these. Moreover, all of these may be formed appropriately by plating, and so on.

On the bonding surface 10A of the base material 10, an area having a predetermined width centering around a boundary line 12 defining each unit area 11 is dug out to a predetermined depth, and a trench section (concave section) 13 including the boundary line 12 and is parallel (or substantially parallel) to the boundary line 12 is formed. The trench section 13 may be formed by, for example, etching, and so on. The depth of the trench section 13 may be appropriately set, but it is desirable to be set so that, in the case of bonding substrates to be described later, the distance to the opposite substrate (hereinafter, which may be referred to as "gap") is 4 μm or more at the trench section 13. This is because injecting a resin having general viscosity becomes difficult when the gap is under 4 μm.

Moreover, the boundary line 12 becomes a cutting line upon segmenting to be described later, that is, a scribe line. However, the boundary line 12 is a conceptual line and need not be formed necessarily linearly on the base material 10.

As shown in the lower part of FIG. 1, using combinations such as substrates 1, a substrate 1 and a substrate having a semiconductor element formed thereon, and substrates 1 having semiconductor elements formed thereon, if at least two substrates are bonded integrally using a wafer direct bonding by being interposed between pressure plates 131 and 132 in a state of two bonding surfaces 10A facing each other, and being pressed while heating by a press apparatus (not shown), a semiconductor device may be constructed by electrically bonding facing electrodes to each other.

For positioning of a substrate during bonding, a well-known wafer bonding apparatus or the like may be used. Moreover, before bonding, a surface of a base material of each substrate and an electrode section may be cleaned by plasma cleaning or reverse sputtering, and so on, and electrodes may be bonded using a so-called surface activating.

Figure 3:
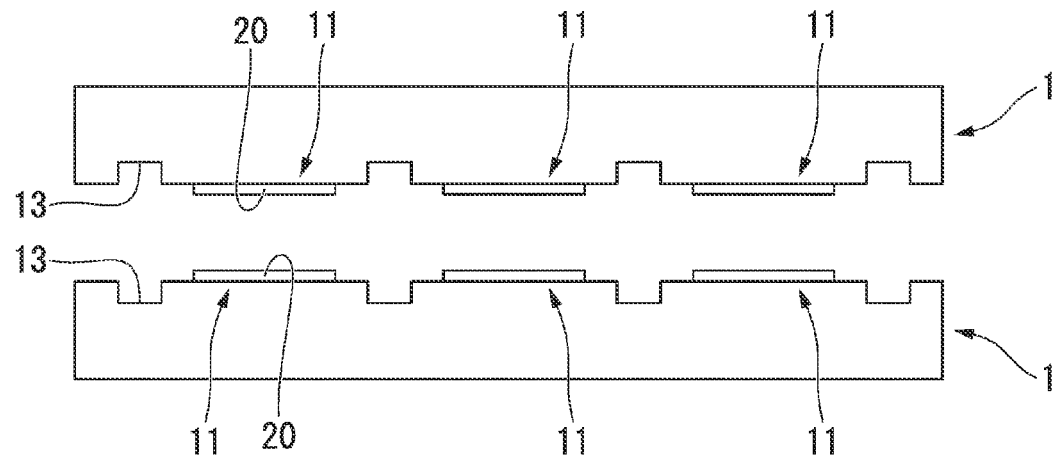
FIG. 3 is a view showing a process while the substrate is bonded in accordance with the first preferred embodiment of the present invention.
Figure 4:
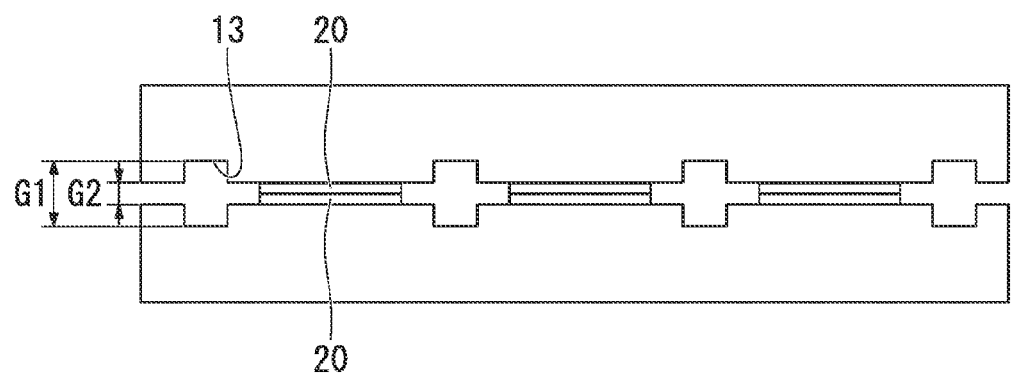
FIG. 4 is a view showing a process while the substrate is bonded in accordance with the first preferred embodiment of the present invention.
Figure 5:
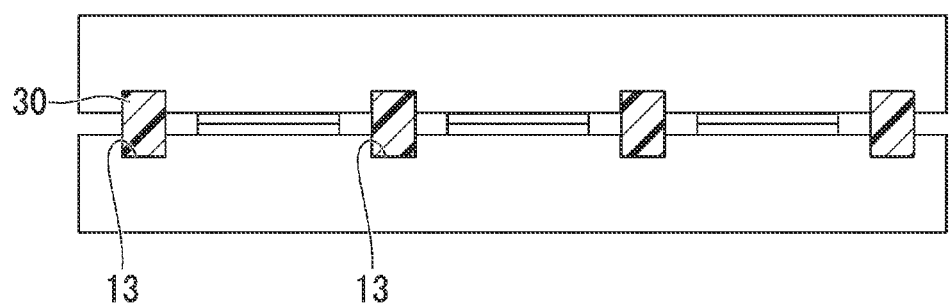
FIG. 5 is a view showing a process while the substrate is bonded in accordance with the first preferred embodiment of the present invention.

Operation of the substrate 1 during the bonding described above will be described. FIG. 3 to FIG. 5 are views showing a process while the substrate 1 is bonded.

As shown in FIG. 3, when the substrates 1 face each other, the unit areas 11 formed on both substrates are positioned to overlap in a plan view of the substrate, and thus the trench sections 13 are also positioned to face each other.

In this state, as shown in FIG. 4, if the electrode sections 20 are bonded to each other, a gap G1 between the substrates at the trench section 13 becomes bigger than a gap G2 between the substrates at parts other than the trench section. If a resin is injected between the substrates in this state, as illustrated in FIG. 5, the resin 30 first smoothly fills the trench section 13 in which injection can be performed easily. Then, the resin 30 overflows from the trench section 13 and fills the periphery of the electrode section 20 or each space between the electrodes of the electrode section 20.

Figure 6:
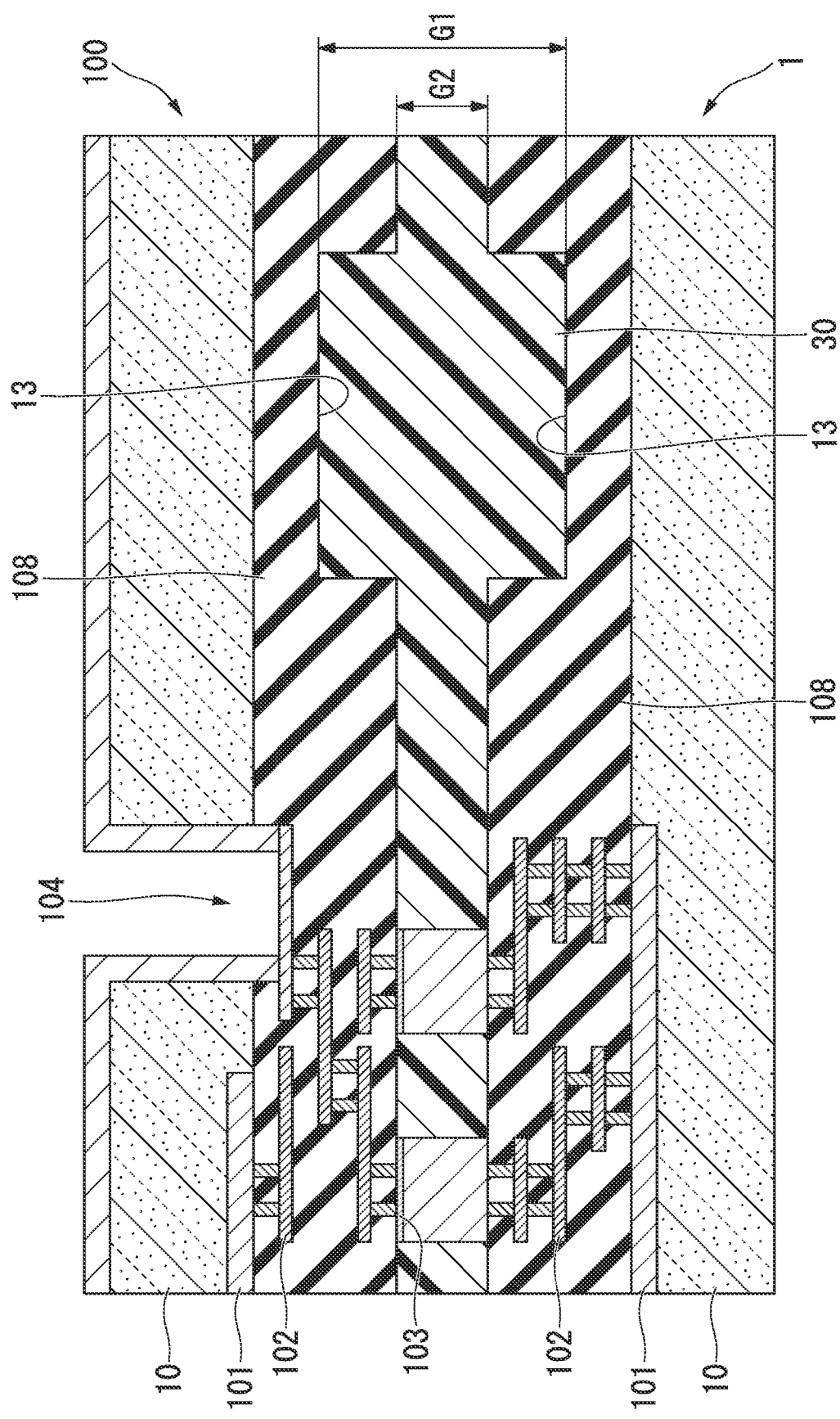
FIG. 6 is a cross sectional view illustrating an example of periphery of a boundary line in the substrate after bonding in accordance with the first preferred embodiment of the present invention.

FIG. 6 is a cross sectional view illustrating an example of periphery of a boundary line in the substrate after injecting the resin 30. In this example, both a wiring substrate 31 and an opposite substrate 100 have a semiconductor element 101 formed by impurity-doping, and so on and a three-dimensionally formed wiring 102 on the base material 10. An electrode of the substrate 100 is formed as a flat electrode pad 103 formed on the wiring 102. A hole to reach the wiring 102 is formed in a bonding surface and an opposite surface of the opposite substrate 100, and is used as an external electrode extraction section 104 for connecting the wiring 102 with an external terminal. The external electrode extraction section 104 may be filled with a conductive material such as metal.

In FIG. 6, the trench section 13 is formed at an interlayer insulating film 108 formed on the base material 10 along with the wiring 102, and has a depth to an extent that it does not pass through the interlayer insulating film 108, but the gap G1 at the trench section 13 is bigger than the gap G2 at the area at which the electrodes are bonded.

Figure 7A:
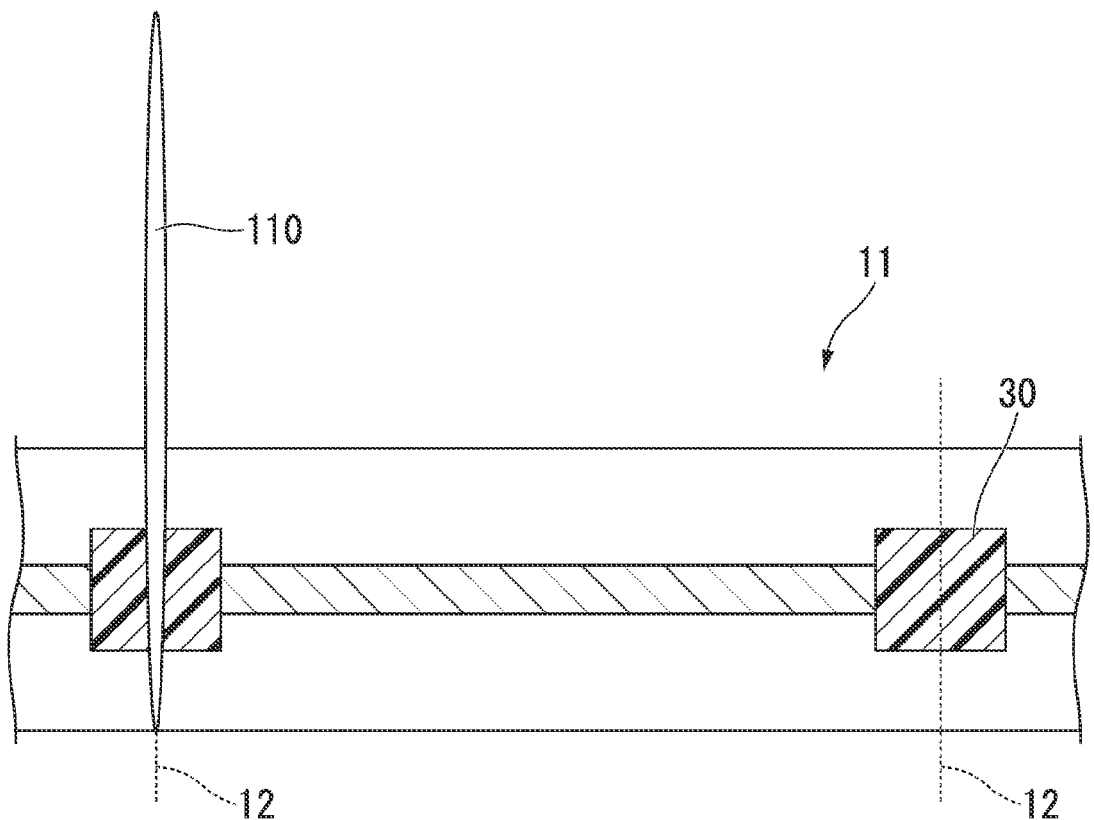
FIG. 7A is a view showing a process of segmenting the substrate in accordance with the first preferred embodiment of the present invention.
Figure 7B:
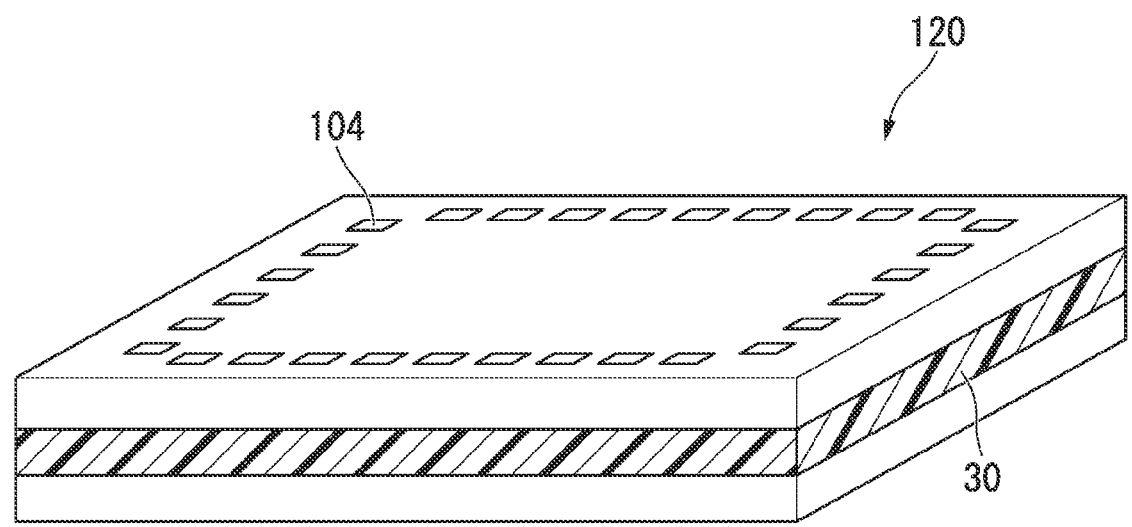
FIG. 7B is a perspective view showing a unit area cut out as a semiconductor device of the substrate in accordance with the first preferred embodiment of the present invention.

FIG. 7A is a view showing a process of segmenting the substrate. FIG. 7B is a perspective view showing a unit area cut out as a semiconductor device of the substrate. As shown in FIG. 7A, after bonding the substrates, when the bonded substrates are cut out (segmented) for every unit area 11 along the boundary line 12 using a blade 110, and so on, a semiconductor device 120 sealed with the resin 30 is completed as shown in FIG. 7B.

As described above, according to the substrate 1 in accordance with the first preferred embodiment of the present invention, since the trench section 13 is provided at a part of the base material 10, even when the electrode section 20 has minute electrodes, a large gap between the substrates at the trench section 13 can be secured when the substrates are bonded. As a result, a resin can be injected appropriately between the bonded substrates, and a semiconductor device can be constructed, in which electrodes and the like are appropriately protected.

Moreover, because the trench section 13 is formed as an area including the boundary line 12 of the unit areas 11, which becomes a scribe line, parts cut out when performing segmenting are reliably strengthened by the injected resin 30, so chipping is appropriately prevented when segmenting is performed.

Figure 8:
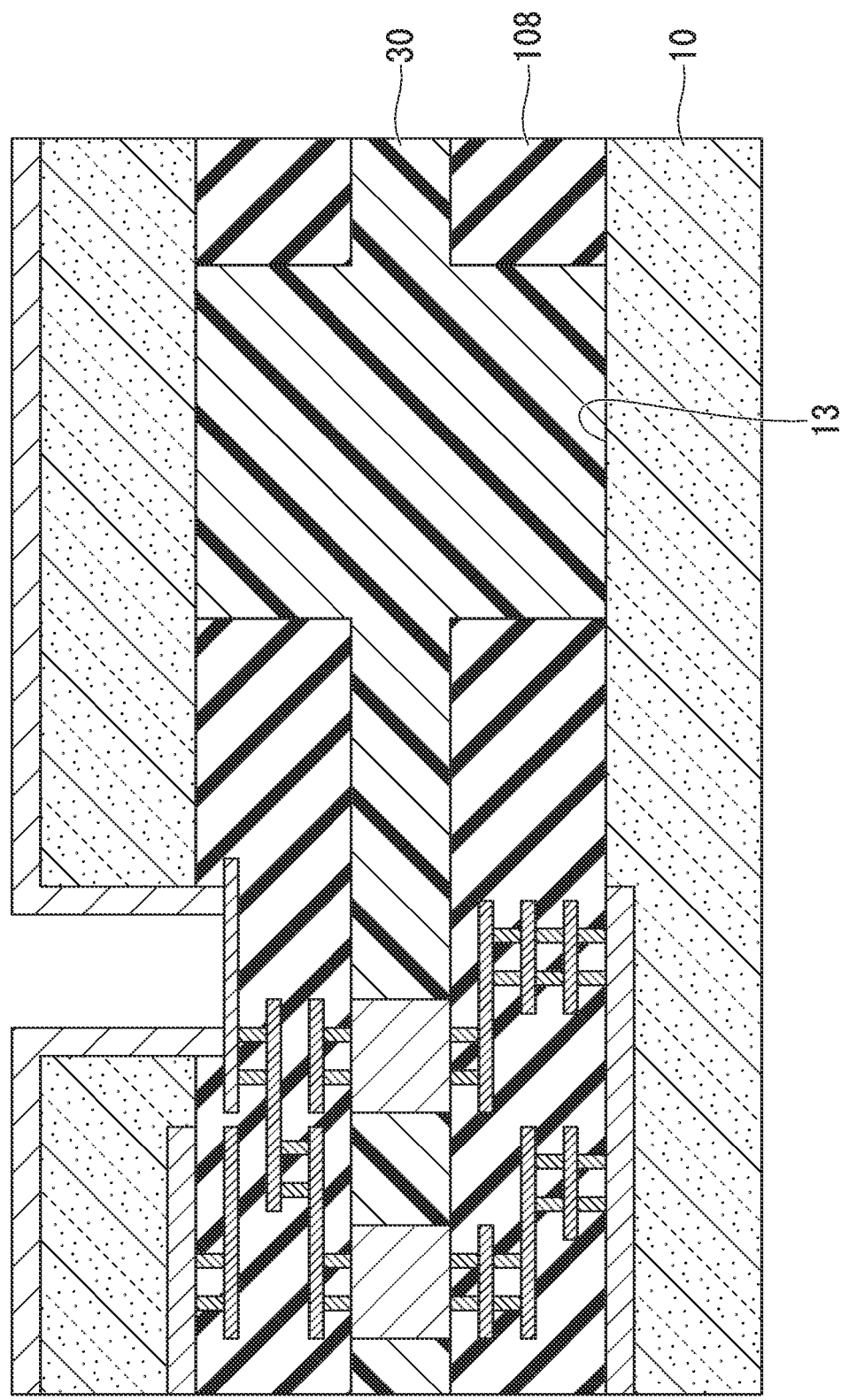
FIG. 8 is a cross sectional view showing another example of a periphery of a boundary line after bonding the substrates of the present invention.

FIG. 8 is a cross sectional view showing another example of a periphery of a boundary line after bonding the substrates of the present invention. As in the modification shown in FIG. 8, the trench section 13 may be formed to reach to the base material 10 by passing through the interlayer insulating film 108. According to this modification, the interlayer insulating film 108 on the base material 10 is divided into each unit area by being cut out along the trench section 13. As a result, stress to the base material 10 generated by the interlayer insulating film 108 is relieved and the base material becomes flatter, thereby improving the quality or yield of a semiconductor device by improving bonding capability between electrodes.

Moreover, the concave section of the present invention may be formed anywhere, regardless of the boundary line, such as at a periphery of the electrode section. However, if the concave section is desirably formed along the boundary line, as in the above-described preferred embodiment, it is possible to inject a resin into all of bonded substrates through the trench section because the concave section in every unit area is connected as the trench section. Also, a part of the trench section is desirably formed to reach the circumference of the base material because an opening of the trench section formed at the circumference can be used as an injection hole of the resin.

Figure 9:
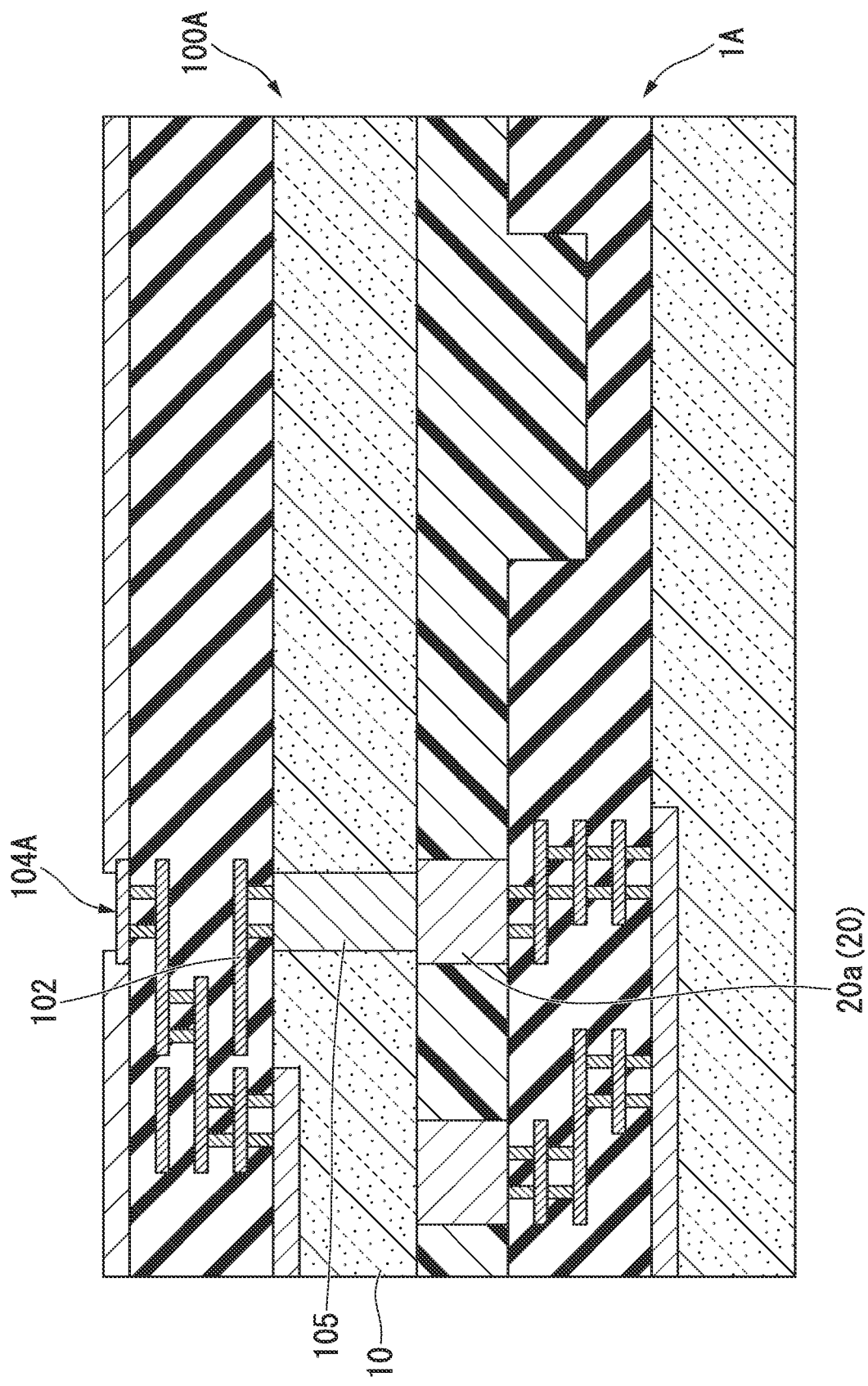
FIG. 9 is a cross sectional view showing another example of periphery of a boundary line after the substrates of the present invention are bonded.

FIG. 9 is a cross sectional view showing another example of periphery of a boundary line after the substrates of the present invention are bonded. As in the modification shown in FIG. 9, the opposite substrate bonded with the substrate 1 of the present invention may have a bonding surface not facing the substrate 1. That is, in this case, a hole reaching the wiring 102 is provided at the base material 10 of the opposite substrate 100A, a penetrating electrode 105 is formed by filling the hole with a conductive material, and the electrode 20a of the electrode section 20 is connected to the penetrating electrode 105. On the other hand, a part exposed to the inner and upper surface of the wiring 102 as it is can be used as an external electrode extracting section 104A.

Moreover, a semiconductor device may be constructed by bonding more than three substrates including at least one substrate of the present invention.

A type of a semiconductor device constructed by bonding a substrate of the present invention is not particularly limited. For instance, for a solid state imaging device, because many electrodes are required to be formed in a small pitch, for example, such as a diameter or pitch of a circuit electrode of 20 μm, adopting the present invention has great merits and is extremely appropriate.

According to the substrate in accordance with the preferred embodiment of the present invention, even if micro electrodes are formed, a resin can be injected appropriately during bonding.

Further, according to the preferred embodiment of the present invention, a semiconductor device having a resin injected appropriately between substrates can be achieved.

As used herein, the following directional terms "forward, rearward, above, downward, right, left, vertical, horizontal, below, transverse, row and column" as well as any other similar directional terms refer to those directions of an apparatus equipped with the present invention. Accordingly, these terms, as utilized to describe the present invention should be interpreted relative to an apparatus equipped with the present invention.

The term "configured" is used to describe a component, unit or part of a device includes hardware and/or software that is constructed and/or programmed to carry out the desired function.

While preferred embodiments of the present invention have been described and illustrated above, it should be understood that these are examples of the present invention and are not to be considered as limiting. Additions, omissions, substitutions, and other modifications can be made without departing from the scope of the present invention. Accordingly, the present invention is not to be considered as being limited by the foregoing description, and is only limited by the scope of the claims.

What is claimed is:

1. A semiconductor device comprising:
   a first substrate having a first surface;
   a first wiring formed in the first substrate;
   a second substrate having a second surface, the second surface facing the first surface;
   a second wiring formed in the second substrate; and
   a plurality of electrodes disposed between the first surface and the second surface, and having a top surface facing to the second surface and a bottom surface facing to the first surface, at least a part of the plurality of electrodes electrically connected to the first wiring via the bottom surface and to the second wiring via the top surface, and
   wherein the first surface includes a first flat surface and a first recessed surface recessed from the first flat surface such that a first distance between the second surface and the first flat surface is smaller than a second distance between the second surface and the first recessed surface,
   wherein a space between the second surface and the first recessed surface is filled with a resin.

2. The semiconductor device according to claim 1, wherein the first substrate comprises:
   a base material; and
   an insulating film disposed on the base material and having the first surface,
   wherein the first wiring is formed in the insulating film,
   wherein a concave section is formed in the insulating film to reach the base material by passing through the insulating film,
   wherein the first recessed surface is a surface of the base material exposed by the concave section.

3. The semiconductor device according to claim 1,
   wherein the first surface has a plurality of unit areas on each of which the plurality of electrodes is formed, and
   wherein the first recessed surface is formed to include a boundary line defining the unit area.

4. The semiconductor device according to claim 1,
   wherein the second distance is set to be equal to or larger than 4 μm.

5. The semiconductor device according to claim 1, wherein the second surface includes a second recessed surface being recessed from the second surface and being opposite to the first recessed surface.

\* \* \* \* \*